United States Patent
Ide

(10) Patent No.: US 10,692,906 B2
(45) Date of Patent: Jun. 23, 2020

(54) CAMERA

(71) Applicant: Axis AB, Lund (SE)

(72) Inventor: Hiroyuki Ide, Tokyo (JP)

(73) Assignee: Axis AB, Lund (SE)

( * ) Notice: Subject to any disclaimer, the term of this patent is extended or adjusted under 35 U.S.C. 154(b) by 0 days.

(21) Appl. No.: 16/150,791

(22) Filed: Oct. 3, 2018

(65) Prior Publication Data

US 2019/0109166 A1 Apr. 11, 2019

(30) Foreign Application Priority Data

Oct. 10, 2017 (EP) .................................. 17195692

(51) Int. Cl.
| | | |
|---|---|---|
| *G03B 17/00* | (2006.01) | |
| *H01L 27/146* | (2006.01) | |
| *G03B 17/12* | (2006.01) | |
| *G03B 17/26* | (2006.01) | |
| *G03B 17/55* | (2006.01) | |
| *H04N 5/225* | (2006.01) | |

(52) U.S. Cl.
CPC ........ *H01L 27/14618* (2013.01); *G03B 17/00* (2013.01); *G03B 17/12* (2013.01); *G03B 17/26* (2013.01); *G03B 17/55* (2013.01); *H04N 5/225* (2013.01)

(58) Field of Classification Search
None
See application file for complete search history.

(56) References Cited

U.S. PATENT DOCUMENTS

| | | | |
|---|---|---|---|
| 8,237,190 B2 | 8/2012 | Chen | |
| 9,137,429 B2 | 9/2015 | Topliss et al. | |
| 9,407,802 B2 | 8/2016 | Nakamura et al. | |
| 2002/0031343 A1* | 3/2002 | Kato | ...................... G03B 17/00 396/72 |
| 2007/0183773 A1 | 8/2007 | Aoki et al. | |
| 2009/0190915 A1* | 7/2009 | Leonelli, Jr. | ........... G03B 17/00 396/419 |

(Continued)

FOREIGN PATENT DOCUMENTS

| | | |
|---|---|---|
| CN | 102854714 A | 1/2013 |
| EP | 2 124 431 A2 | 11/2009 |

(Continued)

OTHER PUBLICATIONS

EP 171956923 European Search Report (dated Mar. 16, 2018).

*Primary Examiner* — Clayton E. LaBalle
*Assistant Examiner* — Dennis Hancock
(74) *Attorney, Agent, or Firm* — Volpe and Koenig, P.C.

(57) ABSTRACT

A camera comprising: a sensor holder, an image sensor mounted on the sensor holder, a mount holder, and a lens mount being adapted to receive a lens array and being mounted to the mount holder, wherein the sensor holder is attached to the mount holder, wherein a gap having an extension along an optical axis of the camera is formed between the sensor holder and the lens mount, and wherein the sensor holder is provided with a thermally conducting protrusion bridging the gap and being in contact with the lens mount at an interface allowing relative motion between the lens mount and the thermally conducting protrusion along the optical axis while maintaining contact between the lens mount and the thermally conducting protrusion.

16 Claims, 3 Drawing Sheets

(56) References Cited

U.S. PATENT DOCUMENTS

| | | | | |
|---|---|---|---|---|
| 2009/0231537 A1* | 9/2009 | Yamamiya | ............. | G03B 17/00 349/200 |
| 2013/0128100 A1 | 5/2013 | Son | | |
| 2013/0279030 A1* | 10/2013 | Calvet | .................... | H02N 1/008 359/823 |
| 2015/0070765 A1* | 3/2015 | Lam | ........................ | G02B 7/08 359/508 |

FOREIGN PATENT DOCUMENTS

| | | |
|---|---|---|
| EP | 3 029 520 A1 | 6/2016 |
| WO | 2008/023894 A1 | 2/2008 |
| WO | 2012015965 A1 | 2/2012 |
| WO | 2012110032 A2 | 8/2012 |

\* cited by examiner

CAMERA

FIELD OF INVENTION

The present teachings relate to an arrangement of an image sensor in a camera and ascertaining heat dissipation from the image sensor.

BACKGROUND

Optical sensors are a necessary and ubiquitous part of the cameras used in the field of digital camera surveillance. Optical sensors differ somewhat in their exact implementation, but a common feature is to use the photoelectric effect to measure light incident to a surface of the optical sensor. The photoelectric effect is a phenomenon wherein electrons of a metal absorb the energy of photons which strike the surface of the metal. Therefore, the optical sensors used in the field of digital camera surveillance can be said to respond to the energy of incident light. A problem arises when the optical sensor also absorbs thermal energy through heat. Such heat may, for example, originate from the electric circuitry used to control and read out the photoelectric information from the optical sensor. The electrons of the optical sensor may absorb such thermal energy and give a signal as though they had measured a photon. This may lead to unwanted saturation and noise of the produced image, making it less clear, meaning that details of the image may be lost. This is typically unwanted in most cases where an image is captured. It is, for example, typically unwanted in the field of surveillance, where details of an image may be of critical or even fatal importance. Therefore, digital cameras are typically designed to divert the heat generated by the processors in the camera. The heat may be conducted to a portion of the camera which has contact with air to which the heat may be dissipated through convection, such as cooling flanges or simply a chassis of the camera. The heat being conducted through parts of the camera may cause said parts to expand or deform in other ways, creating stresses and strains in the camera. This means that the camera must be constructed with these stresses and strains in mind, leading to solutions which may be expensive and difficult to design the camera around. Moreover, expansion or deformation may displace the lens of the camera with regards to the image sensor, causing loss of focus and blurry images as a result. There are numerous prior art attempts to address the above discussed problems.

U.S. Pat. No. 9,407,802 discusses that deterioration in image forming characteristics may be caused by thermal expansion/thermal contraction of adhesive which is used to fix the image. The thermal expansion changes the position of the image sensor which is displaced from the original preferable position, causing the deterioration in image-forming characteristics. In this document this is addressed by providing additional movement suppressing members. However, it may be noted that it does not really address the issue of dissipating heat from the image sensor.

Therefore, there is still room for improvements when it comes to designing a camera which has a reduced risk of loss of focus as a result of thermal expansion, and which still is easy to manufacture and assemble.

SUMMARY

It is an object of the present teachings to mitigate at least some of the problems mentioned above.

This object has been achieved by a camera comprising a sensor holder, an image sensor mounted on the sensor holder, a mount holder, a lens mount being adapted to receive a lens array and being mounted to the mount holder, wherein the sensor holder is attached to the mount holder, wherein a gap having an extension along an optical axis of the camera is formed between the sensor holder and the lens mount, and wherein the sensor holder is provided with a thermally conducting protrusion bridging the gap and being in contact with the lens mount at an interface allowing relative motion between the lens mount and the thermally conducting protrusion along the optical axis while maintaining contact between the lens mount and the thermally conducting protrusion. Allowing relative motion between the lens mount and the thermally conducting protrusion along the optical axis while maintaining contact between the lens mount and the thermally conducting protrusion enables transfer of heat from the sensor holder to the lens mount via the thermally conducting protrusion, while still allowing both the thermally conducting protrusion and the lens mount to expand thermally while avoiding making contact with the sensor holder which otherwise would cause the lens mount to push the lens array away from the image sensor, thereby potentially causing a displacement of the lens with regards to the image sensor.

The sensor holder may be adhesively attached to the mount holder. Attachment by adhesive is a quick and inexpensive way of attaching the sensor holder.

The interface may comprise a first surface on the lens mount facing a second surface on the thermally conducting protrusion, wherein the first and second surfaces both have a normal extending perpendicular to the optical axis. This construction makes it possible to provide a large interface and still allowing relative motion between the lens mount and the thermally conducting protrusion along the optical axis.

The thermally conducting protrusion may be positioned at an intermediate area of the sensor holder, the intermediate area extending around the image sensor and being inside a perimeter of the sensor holder. This placement of the protrusion allows for an efficient heat dissipation from the image sensor without interfering with the attachment of the sensor holder to the mount holder. The intermediate area may be inside a perimeter defined by attachment points between the sensor support and the mount holder. Placing the thermally conducting protrusion in an area extending around the image sensor while being located radially between the image sensor and attachment points of the sensor support and mount holder ensures that heat need not be conducted past the attachment points of the sensor support to be conducted to the lens mount. Thereby, any thermal expansion or contraction of the thermally conducting material does not directly result in displacement of the image sensor. Additionally, the risk of warming the attachment points, such as an adhesive layer, is reduced.

The thermally conducting protrusion may cover at least 50% of the circumference of the intermediate area around the image sensor. Covering at least 50% of the circumference of the intermediate area around the image sensor makes it possible to enable sufficient conduction of heat away from the image sensor.

The first surface of the interface may form a circular outer envelope surface and the second surface of the interface may form a circular inner envelope surface. A principally circular interface spreads heat evenly with regards to direction, counteracting uneven deformation behaviours in the material of the thermally conducting protrusion and the lens mount respectively. Furthermore, any pressure will be distributed more evenly along the interface.

The sensor holder may be a printed circuit board. Printed circuit boards are suitable for holding sensors as they can be made cheaply, and are typically light-weight with a thin profile.

The thermally conducting protrusion may be formed of thermally conducting material attached to the sensor holder. Forming the thermally conducting protrusion from a thermally conducting material increases the amount of thermal energy the thermally conducting protrusion can divert from the sensor to the lens mount per time unit.

The lens mount may be formed of a thermally conductive material, preferably a metallic material. This increases the amount of thermal energy the lens mount can divert from the thermally conducting protrusion, and by extension the sensor, per time unit. Metal is suitable for this purpose as it is typically strong and has good thermal properties.

The camera may comprise a lens array comprising a tubular member supporting one or more lenses, the tubular member being inserted into the lens mount. The tubular member of the lens array may be formed of a thermally conductive material, preferably a metallic material. The lens mount may comprise a tubular portion adapted to receive the lens array. The mount holder comprises a tubular portion adapted to receive the lens mount. These designs enable construction of a camera where the optics are readily mounted during the manufacturing process as well as exchanged for other optics or removed for maintenance.

The mount holder may be formed of a polymer based material. Polymers are suitable for this use as they are generally light-weight and easy to shape into the desired shape.

A further scope of applicability of the present teachings will become apparent from the detailed description given below. However, it should be understood that the detailed description and specific examples, while indicating embodiments of the present teachings, are given by way of illustration only, since various changes and modifications within the scope of the present teachings will become apparent to those skilled in the art from this detailed description.

Hence, it is to be understood that the present teachings are not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

A more detailed understanding may be had from the following description, given by way of example in conjunction with the accompanying drawings where.

DETAILED DESCRIPTION

The present teachings will now be described more fully hereinafter with reference to the accompanying drawings, in which embodiments are shown. The present teachings may, however, be embodied in many different forms and should not be construed as limited to the embodiments set forth herein; rather, these embodiments are provided for thoroughness and completeness, and fully convey the scope of the present teachings to the skilled person.

Figure 1:
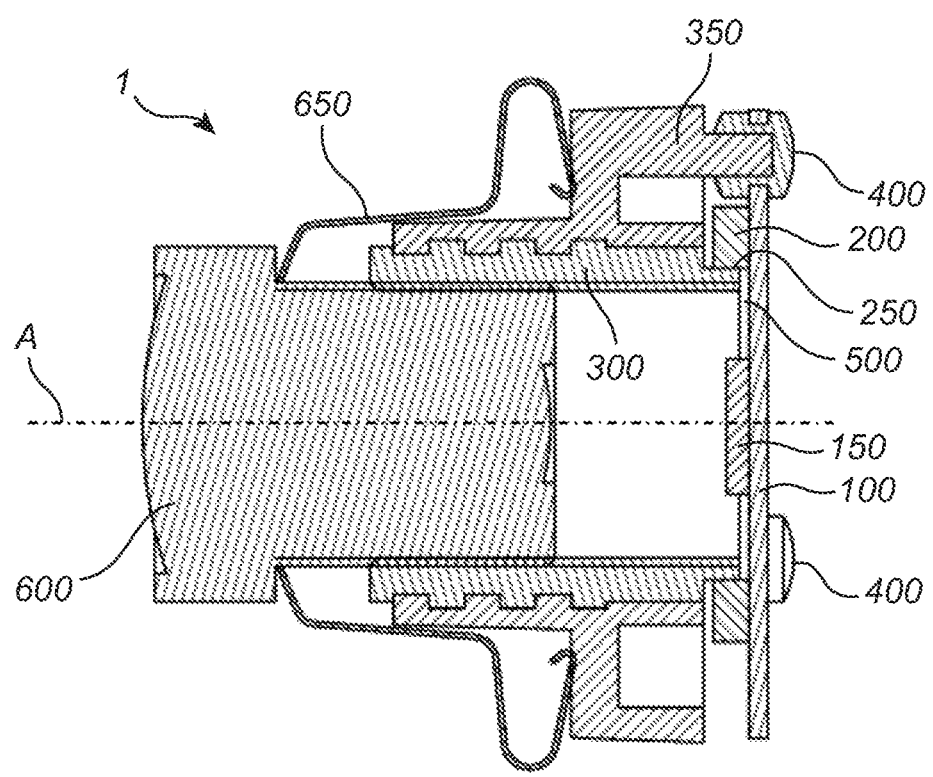
FIG. 1 shows a cross-section of a part of a camera.

FIG. 1 illustrates a cross-section of part 1 of a camera 20. The camera 20 comprises a sensor holder 100, an image sensor 150 mounted on the sensor holder 100, a mount holder 350, and a lens mount 300. The lens mount 300 is adapted to receive a lens array 600 and is mounted to the mount holder 350. The sensor holder 100 is attached to the mount holder 350. As will be elaborated in more detail below, a gap 500 having an extension along an optical axis A of the camera 20 is formed between the sensor holder 100 and the lens mount 300. As will also be elaborated in more detail below, the sensor holder 100 is provided with a thermally conducting protrusion 200 bridging the gap 500 and being in contact with the lens mount 300 at an interface 250 allowing relative motion between the lens mount 300 and the thermally conducting protrusion 200 along the optical axis A while maintaining contact between the lens mount 300 and the thermally conducting protrusion 200.

The mount holder 350 may be made from a polymer-based material. However, the mount holder 350 need not be made from a polymer-based and may be made from any suitably rigid material. Polymer-based materials are preferred as they are typically light-weight, and easy to shape, for example, by injection moulding.

The lens mount 300 may be made out of metal. It may, for example, be made of aluminium. The lens mount 300 need not be made out of metal, but may be made from any suitably rigid material. Metal is preferred as it is rigid and has suitable thermal properties.

The image sensor 150 is configured to detect photons incident to the camera 20, and may be any photo-receptive sensor suitable for imaging use, such as a charge-coupled device (CCD) or an active pixel sensor, such as a complementary metal oxide semiconductor (CMOS). The image sensor 150 may further comprise flat panel detectors, a microbolometer, or other features that facilitate imaging of photons of visible or non-visible wavelengths.

As mentioned above, the image sensor 150 is adapted to be mounted onto the sensor holder 100. This may, for example, be performed by adhesively connecting the image sensor 150 to the sensor holder 100. However, the image sensor 150 may be attached to the sensor holder 100 in other ways. It may, for example, be soldered to the sensor holder 100. It may, for example, be clamped to the sensor holder 100 using a snap-lock or screws.

The sensor holder 100 may be a printed circuit board. Printed circuit boards are suitable for this application as they typically have a thin profile. The printed circuit boards are also light-weight and easy to manufacture, while providing sufficient rigidity. It is also convenient to provide the suitable electric circuitry necessary to control the image sensor 150 and to read out the information from the image sensor 150. The sensor holder 100 may be of another type; it may for instance be a board with components connected with cables rather than a printed circuit board.

It is shown in FIG. 1 that the lens mount 300 and sensor holder 100 are arranged such that a gap 500 is formed between them. The gap 500 has an extension along an imaginary optical axis 10. The optical axis A is typically normal to the image sensor 150 and typically also normal to a main extension of the sensor holder 100.

The sensor holder 100 comprises a thermally conducting protrusion 200. The thermally conducting protrusion 200 has an extension along the imaginary optical axis 10, and is arranged to bridge the gap 500 and be in contact with the lens mount 300, thereby forming an interface 250 between the lens mount 300 and the thermally conducting protrusion 200.

It is possible for the lens mount 300 to expand or move along the optical axis A toward the sensor holder 100 without the lens mount 300 coming into contact with the sensor holder 100 and while maintaining contact between the lens mount 300 and the thermally conducting protrusion 200.

This enables for the thermally conducting protrusion 200 to direct thermal energy away from the image sensor 150, which may otherwise overheat which in turn may lead to noise, and even saturation of the image or damage to the image sensor 150. The thermal energy may then be dispersed into the lens mount 300 through the interface 250 between the thermally conducting protrusion 200 and the lens mount 300. If the thermal energy taken up by the lens mount 300 causes it to expand or otherwise deform, the gap 500 may accommodate a portion of the lens mount 300 thus expanding. This reduces the risk of forces being exerted on the sensor holder 100 by an expanding lens mount 300. Thereby, the risk of the image sensor being displaced in relation to the lens array is reduced.

The sensor holder 100 is attached to the mount holder 350 by way of attachment points 400. The attachment points 400 may be formed using adhesives to connect the mount holder 350 to the sensor holder 100. It may, for example, be a UV hardened adhesive. Using an adhesive mount makes it possible to assemble the camera 20 in an easy and cost-efficient way. This aspect of the present teachings may be facilitated by the gap 500 counteracting forces being exerted onto the sensor holder 100 by movement of the lens mount 300 along the optical axis 10, as adhesives may, especially over time, be less resistant to such forces than for example screws or rivets commonly used in camera construction.

The interface 250 may comprise a first surface 301 on the lens mount 300 and a second surface 202 on the thermally conducting protrusion 200, wherein the first and second surfaces both have a normal extending perpendicular to the optical axis 10. If the lens mount 300 moves or deforms in the direction of the optical axis A due to thermal expansion, the interface having a normal perpendicular to the optical axis A makes it possible for the lens mount 300 to stay in contact with the thermally conducting protrusion 200 while the gap 500 allows for movement or expansion along the optical axis A without the lens mount 300 exerting force in a direction along said optical axis A on the sensor holder 100. In this manner, a thermal connection between the lens mount 300 and the thermally conducting protrusion 200 is maintained.

Figure 2:
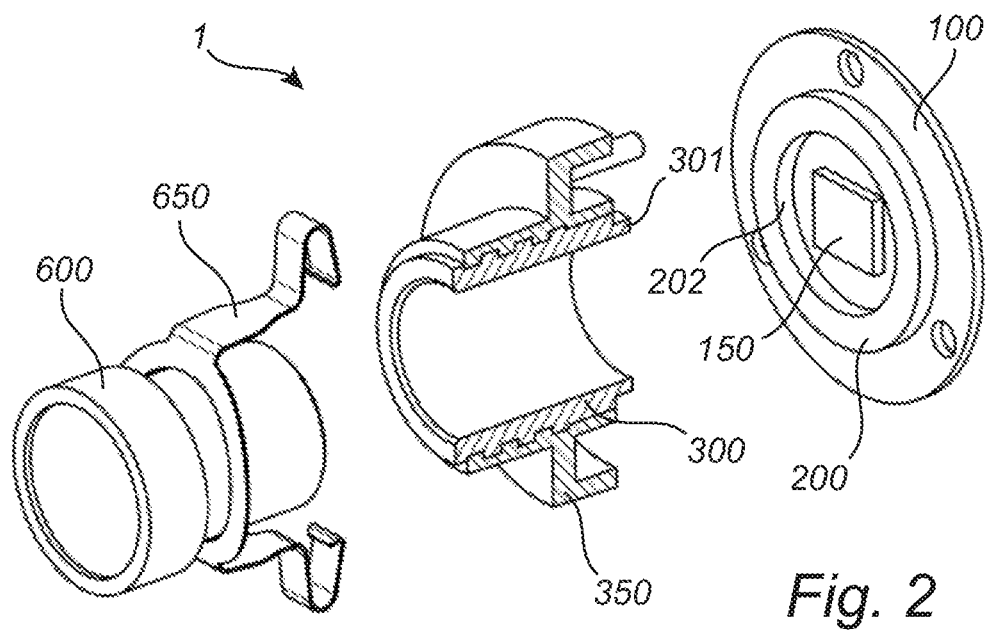
FIG. 2 is an exploded view of the camera part of FIG. 1.

It is disclosed in FIG. 2 that the thermally conducting protrusion 200 is located in an intermediate area radially between the image sensor 150 and the perimeter of the sensor holder 100. Locating the thermally conducting protrusion 200 a distance from the image sensor 150 instead of adjacent to it provides space for the provision of an interface between the lens mount 300 and the thermally conducting protrusion 200 at a position along the optical axis A being overlapping or close to the image sensor 150. The thermally conducting protrusion 200 may be connected to the image sensor 150 by way of at least one thermally conducting spoke (not pictured). The thermal energy may also be transmitted via the printed circuit board as such.

The intermediate area may be located inside a perimeter defined by the attachment points 400. This construction means that heat need not be led past the attachment points 400 to reach the thermally conducting protrusion 200. This is especially advantageous when the attachment points 400 are adhesive attachment points 400, as the adhesives used may be adversely affected by heat.

In the embodiment depicted in the figures, the first surface of the interface 250 forms a circular outer envelope surface 301 and the second surface of the interface 250 forms a circular inner envelope surface 202. A principally circular layout of the thermally conducting protrusion 200 around the image sensor 150 is advantageous because it conducts heat evenly around the image sensor 150 and counteracts directional dependencies in the deformation of the thermally conducting protrusion 200 and the lens mount 300 which receives the heat from the thermally conducting protrusion 200. It is also advantageous because of the mechanical properties of a protrusion with a circular cross-section, such as internal forces on the sensor holder 100 from the thermally conducting protrusion 200 being evenly distributed in all directions from the image sensor 150. Although being preferred it may be noted that the thermally conducting protrusion 200 need not define a closed circle. The thermally conducting protrusion 200 may comprise gaps. The gaps of the thermally conducting protrusion 200 may, for example, accommodate components or to save weight. It is preferred that the thermally conducting protrusion 200 covers at least 50% of the circumference of the intermediate area around the image sensor in order to have a suitable interface area between the thermally conducting protrusion 200 and the lens mount 300. The thermally conducting protrusion 200 is preferably made from a thermally conducting material. It is preferably attached directly to the sensor holder 100. The thermally conducting protrusion 200 is preferably flexible. It may for example be formed of a polymer based material. However, it is also conceivable that the thermally conducting protrusion 200 is formed of a rigid material, such as for example a hard plastic, a metal or a ceramic material.

The lens mount 300 is also formed of a thermally conducting material. It is preferred to form the lens mount 300 from a metallic material.

It will now be described in more detail how the camera 1 is constructed with reference to FIG. 2. In FIG. 2 a lens array 600 is shown. The lens array 600 comprises a tubular member supporting one or more lenses. The lens array 600 serves to direct light toward the image sensor 150, and may be provided with any functionality related thereto found in cameras. These may be perspective-related, for example, wide-angle or macro perspective lenses or they may be related to control of the camera such as actuators for zoom functions or the like. The field of lens arrays for cameras is well developed and the above stated functionalities are intended only as examples. The tubular member is inserted into a tubular portion 350 of the lens mount 300. In the depicted embodiment the tubular member is then held in place by a clip 650, counteracting undesired movement of the lens array 600. The lens array 600 may be held in place in numerous other ways—it is possible to fasten it to the camera with screws, rivets or adhesives, a snap-locking mechanism, or to provide the lens mount 300 and the lens array 600 with threading so as to enable screwing the lens array 600 into the lens mount 300. In an embodiment, the lens mount 300 and lens array 600 are threaded with the lens array 600 being screwed into the lens mount 300. The tubular member of the lens array 600 is also preferably formed of a heat conducting material, preferably metal. The lens mount 300 is attached to the mount holder 350 by way of a tubular portion of the mount holder 350. The lens mount 300 may be attached to the mount holder 350 in some other way, such as screws, rivets, a snap-locking construction or threading of the mount holder 350 onto the lens mount 300. In an embodiment, the mount holder 350 and lens mount 300 are threaded with the mount holder 350 being screwed onto the lens mount 300.

It is contemplated that there are numerous modifications of the embodiments described herein, which are still within the scope of the present teachings as defined by the appended claims.

The attachment points 400 may be formed in other ways than the one in the embodiment described above, in which the sensor holder is adhesively attached to the mount holder. The sensor holder 100 may for example be attached to the mount holder 350 by way of soldering or welding, or by screws, rivets or snap-locking mechanisms.

In the embodiment described above, the interface is shown as being formed of two circular envelope surfaces. The interface may alternatively be laid out in any other geometry around the image sensor 150, such as a rectangle, ellipsis or irregular shape.

Figure 3:
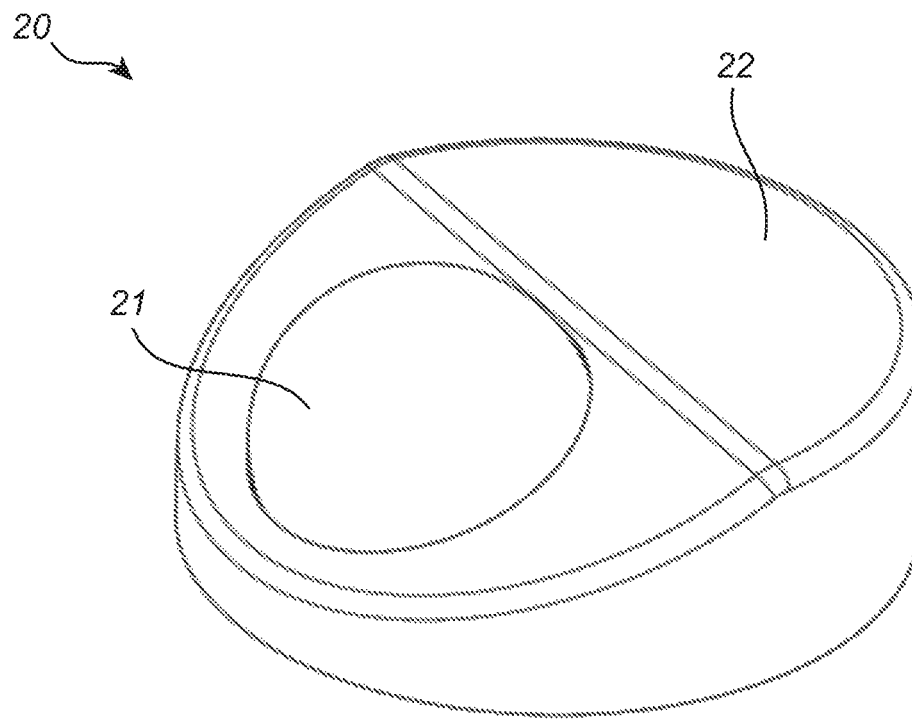
FIG. 3 shows a camera and a camera housing in a disassembled state.
Figure 3:
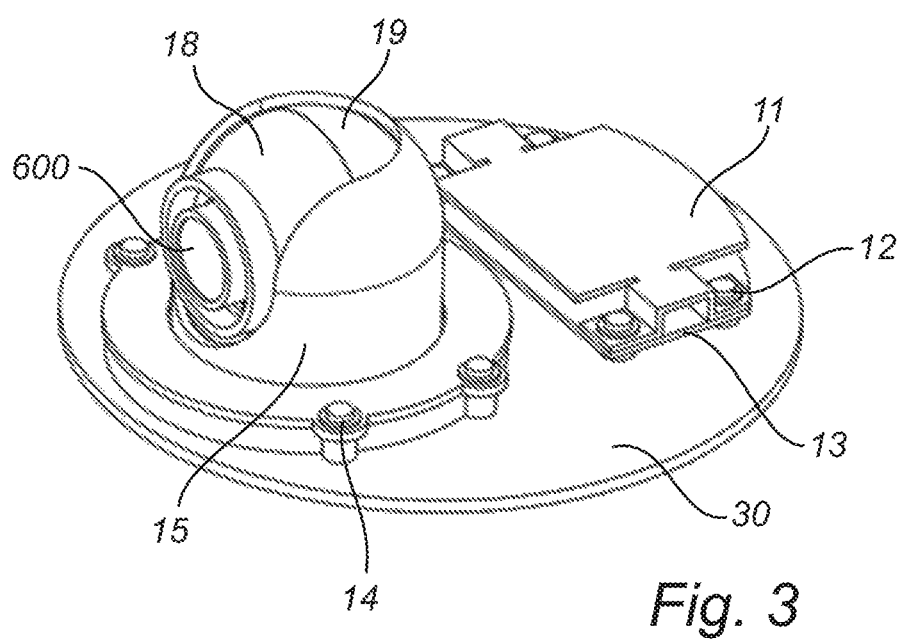
Figure 4:
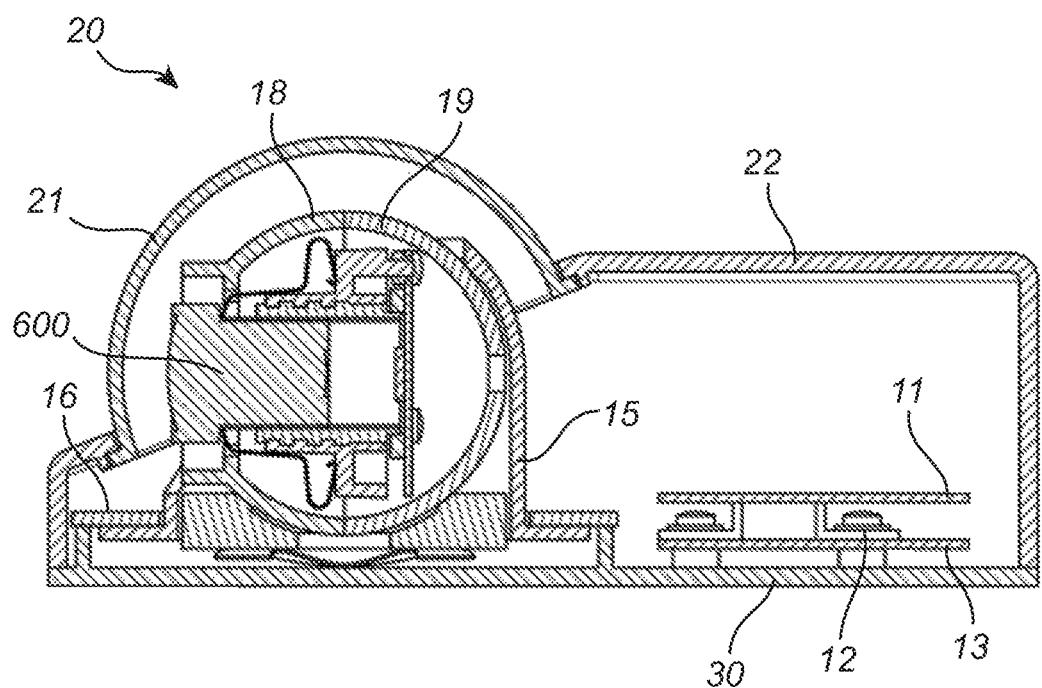
FIG. 4 shows a cross-section of a camera and a camera housing in an assembled state.

FIGS. 3 and 4 illustrate a camera 20 with the above discussed part 1 inside a housing comprising a cover 22 and a base plate 30. In FIG. 3, the camera cover 22 is disassembled from the base plate 30. In FIG. 4, the camera cover 22 is assembled to the base plate 30. The camera cover 22 comprises a window 21, and is designed to be fastened to the base plate 30 such that the camera part 1 can receive light through the window 21. The window 21 may be dome-shaped. On the base plate 30, a first PCB 13 is mounted under a PCB cover 11. The first PCB 13 and the PCB cover 11 are mounted with screws at a first mount point 12. The first PCB 13 may hold electronics, such as processors, memory chips, sensors of different kinds or other kinds of electronics. Rivets or other fastening means may be used instead of screws for the mount points 12. The part 1 of the camera 20 is supported in a front chassis part 18 and a rear chassis part 19 which principally enclose the mount holder 350 along with the lens array 600. The lens array 600 is partially visible, protruding through the front chassis part 18. The front chassis part 18 and the rear chassis part 19 are placed in a swivel mount 15. The swivel mount is arranged to provide the camera with pan and tilt functions for installation purposes. The swivel mount 15 is mounted on the base plate 30 by way of screws, at a second mount point 14. Again, other fastening means than screws may be used. The base plate 30 and camera cover 22 may be made from metal or polymer materials. Polymer materials are advantageous as they may be efficiently manufactured and weather resistant.

What is claimed is:

1. A camera comprising:
a sensor holder;
an image sensor mounted on the sensor holder;
a mount holder; and
a lens mount being adapted to receive a lens array and being mounted to the mount holder,
wherein the sensor holder is attached to the mount holder,
wherein a gap having an extension along an optical axis of the camera is defined between the sensor holder and the lens mount, and
wherein the sensor holder is provided with a thermally conducting protrusion bridging the gap and contacting the lens mount at an interface allowing relative motion along the optical axis between the lens mount and the thermally conducting protrusion while maintaining contact between the lens mount and the thermally conducting protrusion.

2. The camera according to claim 1, wherein the sensor holder is adhesively attached to the mount holder.

3. The camera according to claim 1, wherein the interface comprises a first surface on the lens mount facing a second surface on the thermally conducting protrusion, wherein the first and second surfaces both have a normal extending perpendicular to the optical axis.

4. The camera according to claim 3, wherein the first surface of the interface forms a circular outer envelope surface and the second surface of the interface forms a circular inner envelope surface.

5. The camera according to claim 1, wherein the thermally conducting protrusion is positioned at an intermediate area of the sensor holder, the intermediate area extending around the image sensor and being inside a perimeter of the sensor holder.

6. The camera according to claim 5, wherein the intermediate area is inside a perimeter defined by attachment points between the sensor support and the mount holder.

7. The camera according to claim 5, wherein the thermally conducting protrusion covers at least 50% of the circumference of the intermediate area around the image sensor.

8. The camera according to claim 1, wherein the sensor holder is a printed circuit board.

9. The camera according to claim 1, wherein the thermally conducting protrusion is formed of thermally conducting material attached to the sensor holder.

10. The camera according to claim 1, wherein the lens mount is formed of a thermally conducting material, preferably a metallic material.

11. The camera according to claim 1, further comprising a lens array comprising a tubular member supporting one or more lenses, the tubular member being inserted into the lens mount.

12. The camera according to claim 11, wherein the tubular member of the lens array is formed of a thermally conducting material, preferably a metallic material.

13. The camera according to claim 1, wherein the lens mount comprises a tubular portion adapted to receive the lens array.

14. The camera according to claim 1, wherein the mount holder comprises a tubular portion adapted to receive the lens mount.

15. The camera according to claim 1, wherein the mount holder is formed of a polymer based material.

16. The camera according to claim 1, wherein the interface is partially defined on a radially outer surface of the lens mount and partially defined on a radially inner surface of the thermally conducting protrusion.

* * * * *